(12) United States Patent
Nicoloff

(10) Patent No.: US 11,147,179 B2
(45) Date of Patent: *Oct. 12, 2021

(54) MOUNTING SYSTEM FOR MECHANICAL-SHOCK RESISTANT PRINTED CIRCUIT BOARD (PCB)

(71) Applicant: AeroVironment, Inc., Simi Valley, CA (US)

(72) Inventor: William John Nicoloff, Camarillo, CA (US)

(73) Assignee: AEROVIRONMENT, INC., Arlington, VA (US)

( * ) Notice: Subject to any disclaimer, the term of this patent is extended or adjusted under 35 U.S.C. 154(b) by 69 days.

This patent is subject to a terminal disclaimer.

(21) Appl. No.: 16/798,801

(22) Filed: Feb. 24, 2020

(65) Prior Publication Data

US 2020/0196476 A1 Jun. 18, 2020

Related U.S. Application Data

(63) Continuation of application No. 16/218,961, filed on Dec. 13, 2018, now Pat. No. 10,617,028, which is a
(Continued)

(51) Int. Cl.
*H05K 1/18* (2006.01)
*H05K 7/14* (2006.01)
(Continued)

(52) U.S. Cl.
CPC ............. *H05K 7/1422* (2013.01); *B64C 1/06* (2013.01); *B64D 45/00* (2013.01); *H05K 1/0271* (2013.01);
(Continued)

(58) Field of Classification Search
CPC .... H05K 7/1422; H05K 1/0271; H05K 1/181; H05K 5/0034; H05K 5/0217;
(Continued)

(56) References Cited

U.S. PATENT DOCUMENTS 5,199,670 A * 4/1993 Cheltenham ........... A63H 27/08
244/154
5,229,923 A 7/1993 Long et al.
(Continued)

FOREIGN PATENT DOCUMENTS

CN 203698655 U 7/2014
JP H1298169 A 10/1999
(Continued)

OTHER PUBLICATIONS

International Search Report for PCT/US16/23119 dated Aug. 18, 2016.

*Primary Examiner* — Abhishek M Rathod
*Assistant Examiner* — Keith DePew
(74) *Attorney, Agent, or Firm* — Concept IP LLP; Michael Zarrabian; Eric Aagaard

(57) ABSTRACT

A shock resistant fuselage system includes first and second fuselage side walls, each of the first and second fuselage side walls having a plurality of guide posts, and a printed circuit board (PCB) rigidly attached to at least one of the first and second fuselage side walls, the PCB having a plurality of guide slots, each of the plurality of guide posts slideably seated in a respective one of the plurality of guide slots so that elastic deformation of the PCB is guided by the guide slots between the first and second fuselage side walls.

20 Claims, 8 Drawing Sheets

Related U.S. Application Data continuation of application No. 15/074,236, filed on Mar. 18, 2016, now Pat. No. 10,194,551.

(60) Provisional application No. 62/135,615, filed on Mar. 19, 2015.

(51) Int. Cl.
| | |
|---|---|
| *H05K 1/02* | (2006.01) |
| *B64C 1/06* | (2006.01) |
| *B64D 45/00* | (2006.01) |
| *H05K 5/00* | (2006.01) |
| *H05K 5/02* | (2006.01) |
| *H05K 7/18* | (2006.01) |
| *B64C 1/00* | (2006.01) |
| *B64C 39/02* | (2006.01) |

(52) U.S. Cl.
CPC ............ *H05K 1/181* (2013.01); *H05K 5/0034* (2013.01); *H05K 5/0217* (2013.01); *H05K 7/183* (2013.01); *B64C 1/00* (2013.01); *B64C 39/024* (2013.01); *H05K 2201/09063* (2013.01); *H05K 2201/10522* (2013.01); *H05K 2201/10628* (2013.01); *H05K 2201/2027* (2013.01); *H05K 2201/2045* (2013.01); *H05K 2203/167* (2013.01)

(58) Field of Classification Search
CPC ......... H05K 7/183; H05K 2201/09063; H05K 2201/10522; H05K 2201/10628; H05K 2201/2027; H05K 2201/2045; H05K 2203/167; B64C 1/06; B64C 1/00; B64C 39/024; B64D 45/00
See application file for complete search history.

(56) References Cited

U.S. PATENT DOCUMENTS

| | | | | |
|---|---|---|---|---|
| 5,932,065 | A | | 8/1999 | Mitchell |
| 5,959,844 | A | * | 9/1999 | Simon ................... B60K 37/02 361/759 |
| 6,490,165 | B2 | * | 12/2002 | Mizusaki ............. H05K 1/0271 361/736 |
| 6,532,152 | B1 | * | 3/2003 | White ............... G02F 1/133308 361/692 |
| 6,762,944 | B2 | | 7/2004 | Mizusaki |
| 7,264,501 | B1 | * | 9/2007 | Lin ........................ H05K 7/142 174/138 G |
| 7,385,830 | B2 | * | 6/2008 | Liu ........................ H05K 7/142 174/138 R |
| 8,406,009 | B2 | * | 3/2013 | Lev ........................ H05K 7/142 361/807 |
| 2002/0057556 | A1 | * | 5/2002 | Mizusaki ............... H05K 7/142 361/752 |
| 2003/0030997 | A1 | * | 2/2003 | Mizusaki ............. H05K 1/0271 361/758 |
| 2004/0120108 | A1 | | 6/2004 | Wang |
| 2004/0196637 | A1 | * | 10/2004 | Le .......................... H05K 7/142 361/758 |
| 2005/0184063 | A1 | * | 8/2005 | Kim ..................... H05B 6/6435 219/702 |
| 2006/0114662 | A1 | | 6/2006 | Liu et al. |
| 2006/0200313 | A1 | | 9/2006 | Bringuel et al. |
| 2007/0133187 | A1 | * | 6/2007 | Lin ...................... H05K 1/0215 361/799 |
| 2010/0284143 | A1 | * | 11/2010 | Lev ..................... H05K 1/0271 361/679.55 |
| 2014/0104791 | A1 | * | 4/2014 | Yang ................... H01L 23/4093 361/720 |
| 2014/0332620 | A1 | * | 11/2014 | Earon .................... B64D 47/08 244/13 |
| 2015/0025355 | A1 | | 1/2015 | Bailey et al. |
| 2015/0139755 | A1 | * | 5/2015 | Lu ........................ F16B 19/004 411/510 |
| 2017/0124369 | A1 | * | 5/2017 | Rueblinger ........... G06F 1/1658 |

FOREIGN PATENT DOCUMENTS

| | | |
|---|---|---|
| JP | 2002151866 A | 5/2002 |
| JP | 2012528408 A | 11/2012 |

* cited by examiner

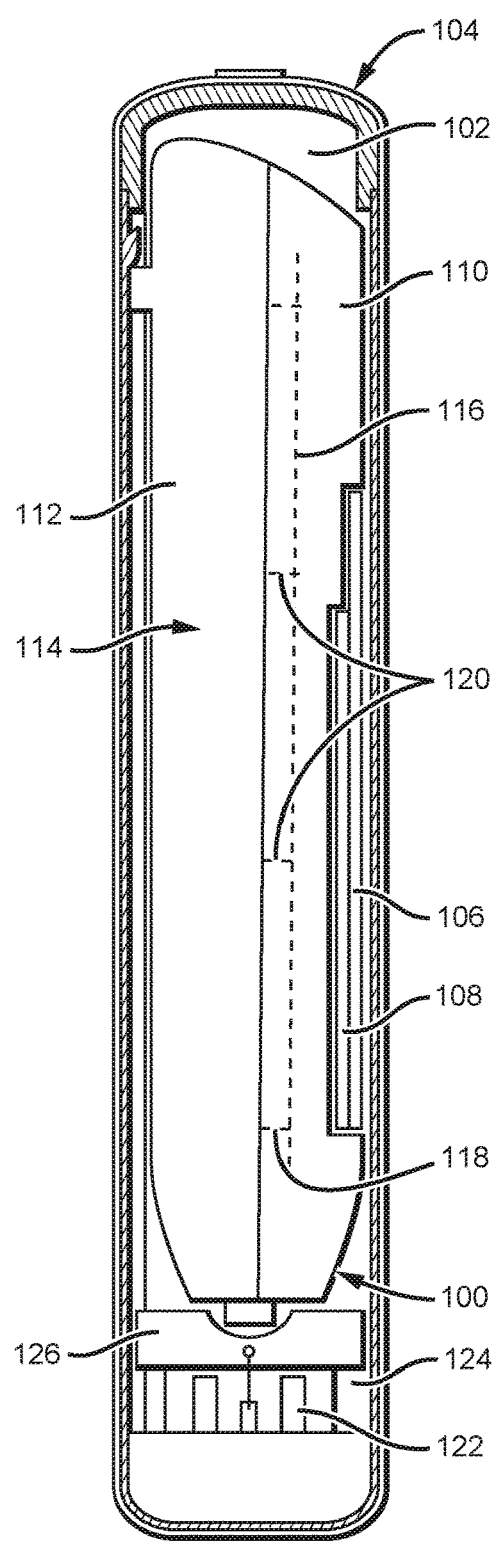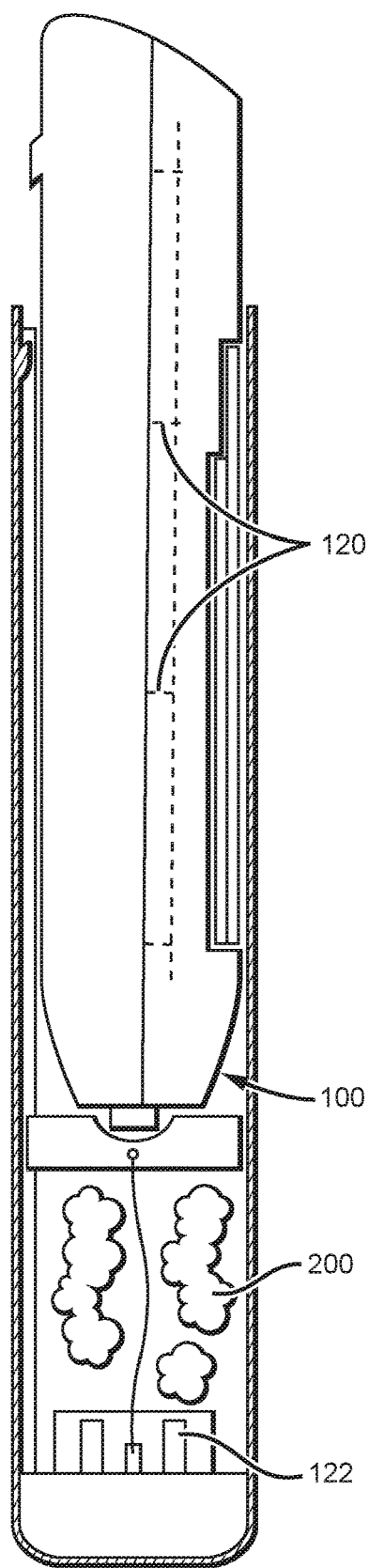
FIG. 1
FIG. 2

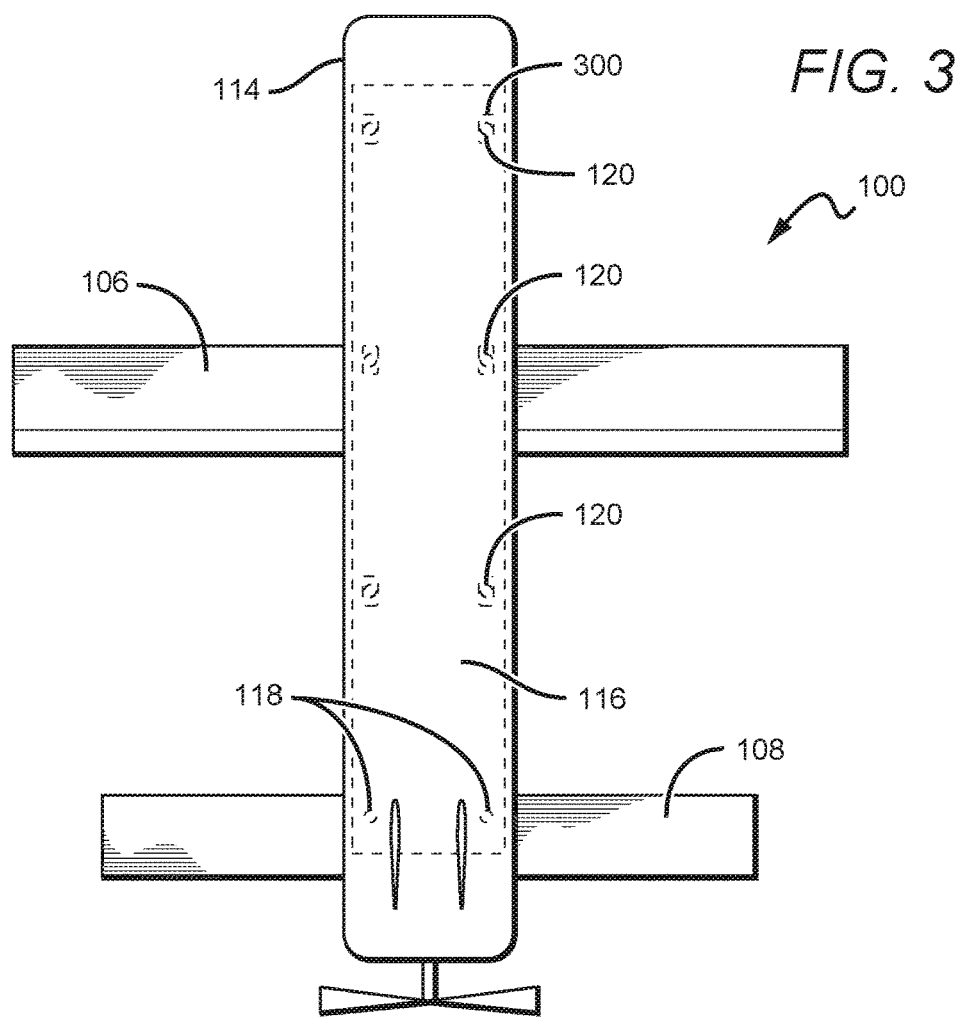
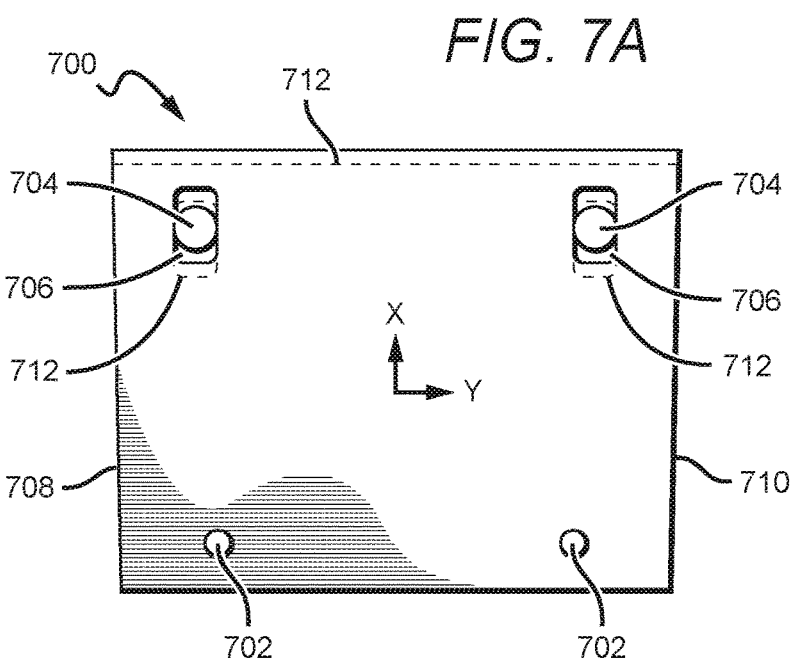

FIG. 13
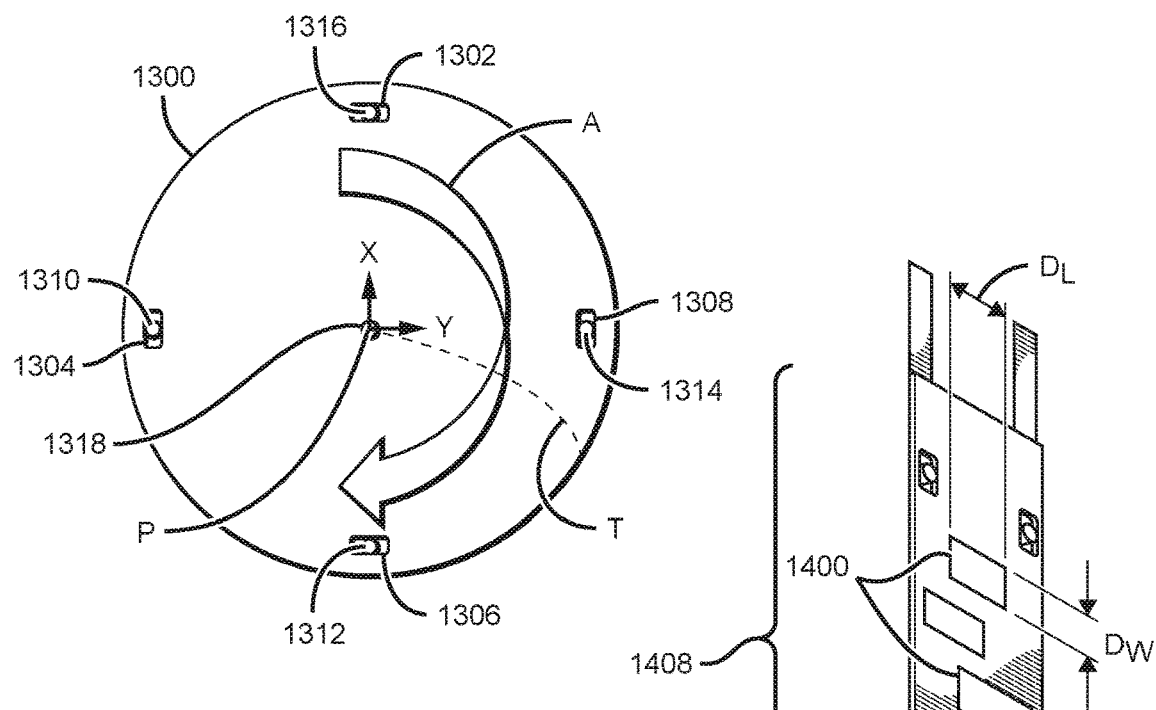
FIG. 14A
FIG. 14B
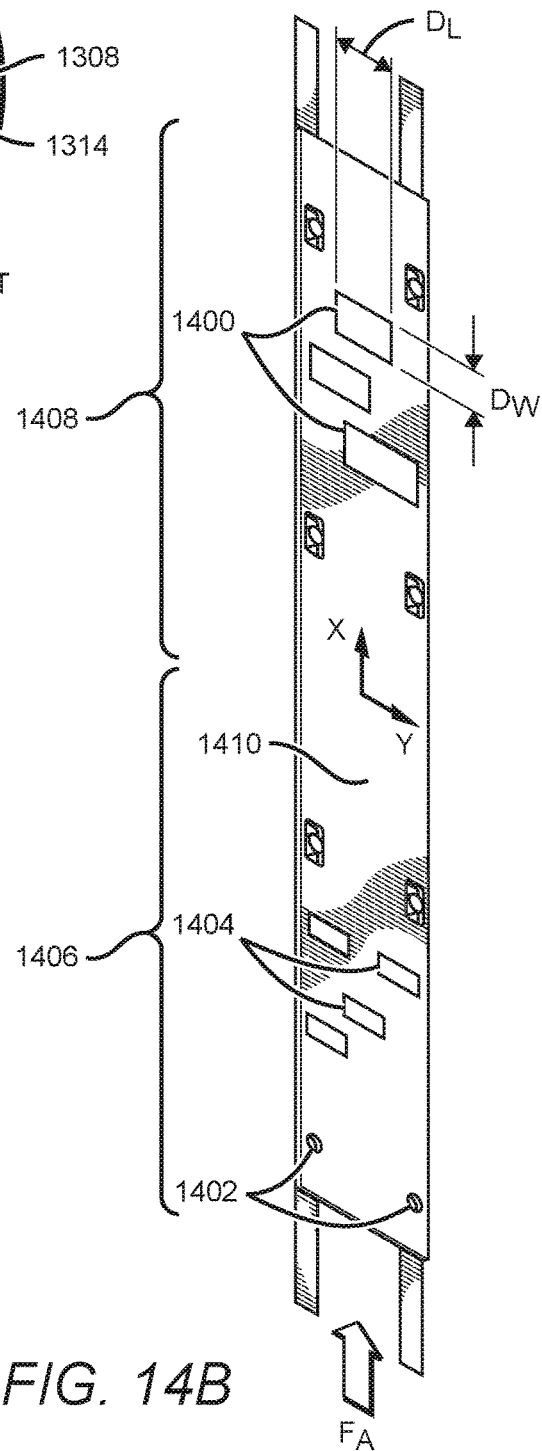

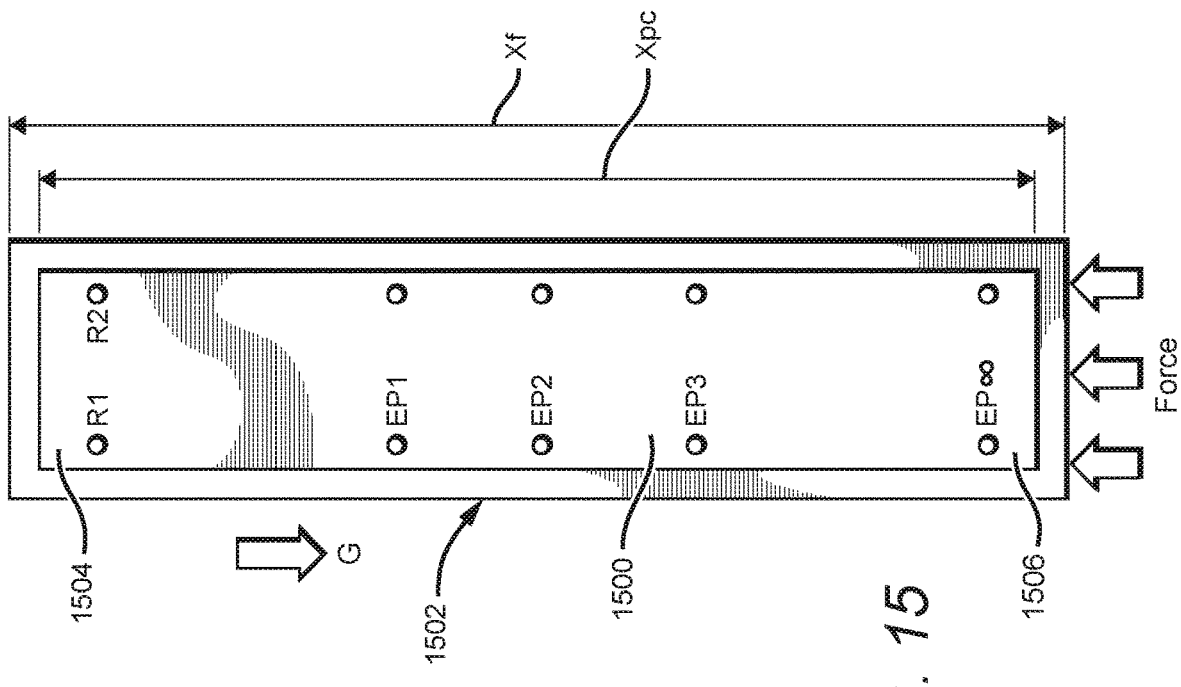

US 11,147,179 B2

MOUNTING SYSTEM FOR MECHANICAL-SHOCK RESISTANT PRINTED CIRCUIT BOARD (PCB)

CROSS-REFERENCE TO RELATED APPLICATIONS

This application is a continuation of U.S. Nonprovisional patent application Ser. No. 16/218,961, filed Dec. 13, 2018, which is a continuation of U.S. Nonprovisional patent application Ser. No. 15/074,236, filed Mar. 18, 2016, which issued as U.S. Pat. No. 10,194,551 on Jan. 29, 2019, which claims priority to and the benefit of U.S. Provisional Patent Application No. 62/135,615, filed Mar. 19, 2015, the contents of all of which are hereby incorporated by reference herein for all purposes.

FIELD OF THE INVENTION

The field of the invention relates to components mounted on a printed circuit board (PCB), and more particularly to PCB assemblies subject to mechanical shock.

DESCRIPTION OF THE RELATED ART

A printed circuit boards (PCB) may be subject to mechanical shock due to suddenly applied forces that result in acceleration, whether through ordinary use or accidents. Such forces may result in elastic deformation of the PCB which may not be compatible with electrical components mounted on the PCB or their connections to the PCB.

A need exists to mitigate the effects of suddenly applied forces on PCBs that have mounted electrical components.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which:

FIGS. 1 and 2 are side sectional views of pre-launch and during-launch embodiments, respectively, of a shock resistant mounted printed circuit board (PCB) system used in an unmanned aerial vehicle (UAV) being launched from a launch tube;

FIG. 3 is a top plan view of a UAV using a PCB mounted for shock resistance inside a fuselage of a UAV, with the internal shock resistant PCB indicated with dashed lines;

FIG. 7A top plan view of a portion of a PCB, with elastic compression of a PCB during sudden acceleration indicated with dashed lines;

FIG. 13 is a top plan view of another embodiment of a PCB having a fixed mounting point and guide slots that each accept a guide post for use during sudden angular acceleration (indicated by an arrow);

FIG. 14A is a graph illustrating compression displacement versus PCB component location;

FIG. 14B is a perspective view illustrating various component widths, lengths and their PCB placement on a PCB having two fixed mounting points at its distal end;

FIG. 14C is a graph depicting electrical component width $D_W$ versus distance from the fixed mounting points; and FIG. 15 is a simplified overhead plan view depicting a PCBA board rigidly coupled to a fuselage at a proximal end and elastically coupled at a plurality of points removed from the proximal location.

SUMMARY

Figure 4:
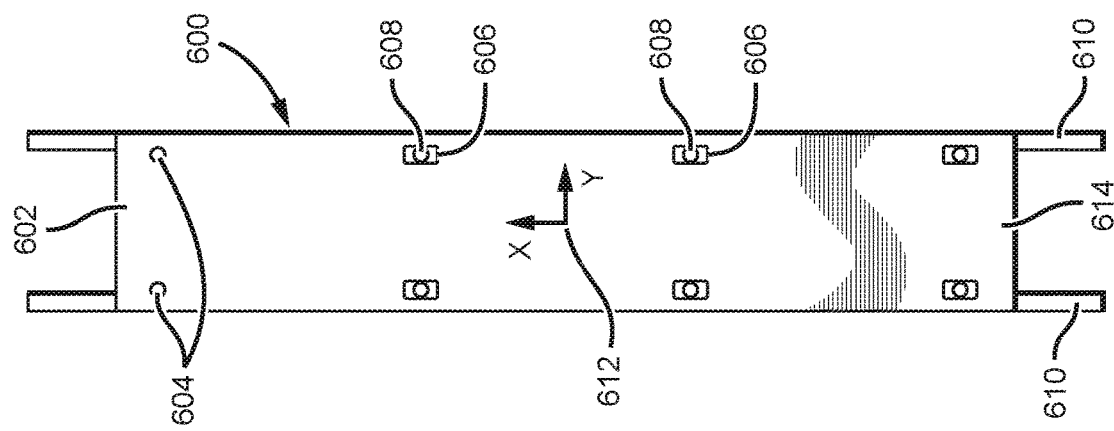
FIGS. 4, 5, and 6 are top sectional views of three different embodiments of a PCB supported by a frame (such as fuselage sidewalls) with the PCB allowed to elastically deform under an axial load to create a shock-resistant PCB system.

A shock resistant fuselage system may include first and second fuselage side walls, each of the first and second fuselage side walls having a plurality of guide posts, and a printed circuit board (PCB) rigidly attached to at least one of the first and second fuselage side walls, the PCB having a plurality of guide slots, each of the plurality of guide posts slideably seated in a respective one of the plurality of guide slots so that elastic deformation of the PCB is guided by the guide slots between the first and second fuselage side walls. The first and second fuselage side walls may be first and second fuselage side walls of a unitary fuselage clam shell. A major longitudinal axis of each of the plurality of guide slots may extend parallel to a major longitudinal axis of the first and second fuselage side walls. A major longitudinal axis of each of the plurality of guide slots may extend parallel to a major longitudinal axis of the first and second fuselage side walls. The PCB may be rigidly attached to the at least one of the first and second fuselage side walls at a front of the PCB board. The PCB may be rigidly attached to the at least one of the first and second fuselage side walls at a rear of the PCB board. The system may also include a plurality of electrical components mounted to the PCB, each of the plurality of electrical components mounted with their major longitudinal axis oriented perpendicularly to the major longitudinal axis of each of the first and second fuselage side walls. The system may include a plurality of electrical components mounted to the PCB such that a larger proportion of larger electrical components of the plurality of electrical components are mounted at a PCB front end than a PCB rear end.

A shock resistant printed circuit board (PCB) mounting system may include a PCB board having a plurality of guide slots and a frame rigidly coupled to the PCB board and having a plurality of guide posts, each one of the plurality of guide posts seated in a respective one of the plurality of guide slots so that elastic deformation of the PCB is guided by the guide slots. In such embodiments, a major longitudinal axis of each one of the plurality of guide slots may extend parallel to a major longitudinal axis of the PCB. In some embodiments, the frame may be rigidly coupled to the PCB board in a center region of the PCB, and a major longitudinal axis of each one of the plurality of guide slots may extend radially toward the center region of the PCB. In other embodiments, the frame may include first and second fuselage side walls of a unitary fuselage clam shell.

A method of printed circuit board (PCB) shock resistance may include the steps of inducing an acceleration in a PCB in a first direction, rigidly restraining a PCB at one end of the PCB during the acceleration, and guiding elastic deformation of the PCB along a the first direction so that the PCB experiences reduced peak acceleration at PCB points removed from the one end. The step of rigidly restraining a PCB at one end may include coupling the PCB to an unmanned aerial vehicle fuselage.

A shock resistant printed circuit board (PCB) may include a plurality of guide slots for receiving a plurality of guide posts and at least one mounting hole for receiving at least one fixed post so that elastic deformation of the PCB is guided by the plurality of guide slots. In such embodiments, the PCB may include a plurality of electrical components mounted to the PCB, and the plurality of electrical components mounted to the PCB are arranged such that electrical components having relatively larger widths are mounted distal from the at least one mounting hole. In such embodiments, the plurality of electrical components mounted to the PCB may be arranged such that electrical components having relatively smaller widths are mounted closer to the at least one mounting hole than the electrical components having relatively larger widths. The plurality of electrical components mounted to the PCB may be arranged based on component density relative to a distance from the at least one mounting hole. In such embodiments, a leaded integrated circuit (IC) component of the plurality of electrical components may be disposed closer to the at least one mounting hole than a ceramic component of the plurality of electrical components. The plurality of guide slots may be arranged such that the received plurality of guide posts can only slide axially and are restrained from sliding orthogonally. The plurality of guide slots may be aligned towards the at least one mounting hole. The at least one mounting hole may be disposed at a central mounting point of the PCB. The at least one mounting hole may be disposed at a center of mass of the PCB. The PCB may be circular, so each of the plurality of guide slots may have a respective major axis that is directed circumferentially about the PCB, with torsional deformation of the PCB about the at least one mounting hole.

DETAILED DESCRIPTION

A mechanical-shock resistant printed circuit board (PCB) system is described that mitigates the effects of forces that are suddenly applied to the PCB board, mounted components, and on the frame supporting the PCB, such as by sudden acceleration of the system. The PCB acts as a structural member to inhibit the frame in response to the sudden loads. More particularly, the shock resistant PCB system includes a PCB board having a plurality of guide slots, and a frame rigidly coupled to the PCB board and having a plurality of guide posts, each one of the plurality of guide posts seated in a respective one of the plurality of guide slots so that elastic deformation of the PCB is guided by the guide slots.

FIGS. 1, 2 and 3 illustrate one embodiment of a shock resistant PCB system used in an unmanned aerial vehicle (UAV) launched from a launch tube. The UAV 100 is illustrated seated in an interior 102 of a UAV launch tube 104 in preparation for launch. The illustrated UAV 100 has wings 106 and rear horizontal stabilizers 108 that are in their stowed positions, and upper and lower fuselage side walls (110, 112) that collectively form a fuselage 114 for the UAV 100. The upper and lower fuselage side walls (110, 112) may also serve as a frame for support of a PCB 116, with the PCB 116 rigidly coupled to at least one rear guide post 118 extending from one of the upper or lower fuselage side walls (110, 112). The PCB is also slideably guided by a plurality of forward guide posts 120 that extend through a respective plurality of PCB guide slots 300. As used herein, "forward" is in the direction of sudden acceleration.

Gas generators 122 activated on a high pressure side 124 of a launch puck 126 may create high pressure gas 200 that propels the launch puck 126, UAV 100 and associated upper and lower fuselage side walls (110, 112) up through the interior 102 in a high-gravity ("high-G") launch that may approach one-thousand times the acceleration of gravity ("g"), with normal loads approaching 600 g. The PCB board 116, as coupled to the rear guide post 118, is also induced to accelerate with the UAV within the fuselage. However, that portion of the PCB forward of the rear guide post 118 is partially decoupled from the acceleration forces experienced by the UAV, as the plurality of PCB guide slots 300 allow the respective forward guide posts 120 to slide as the PCB experiences elastic deformation due to the high-G launch.

After launch (see FIG. 3), the UAV 100 and PCB 116 do not experience significant acceleration forces and the PCB 116 returns to its nominal elastic state as supported and guided by the forward guide posts 120.

Figure 5:
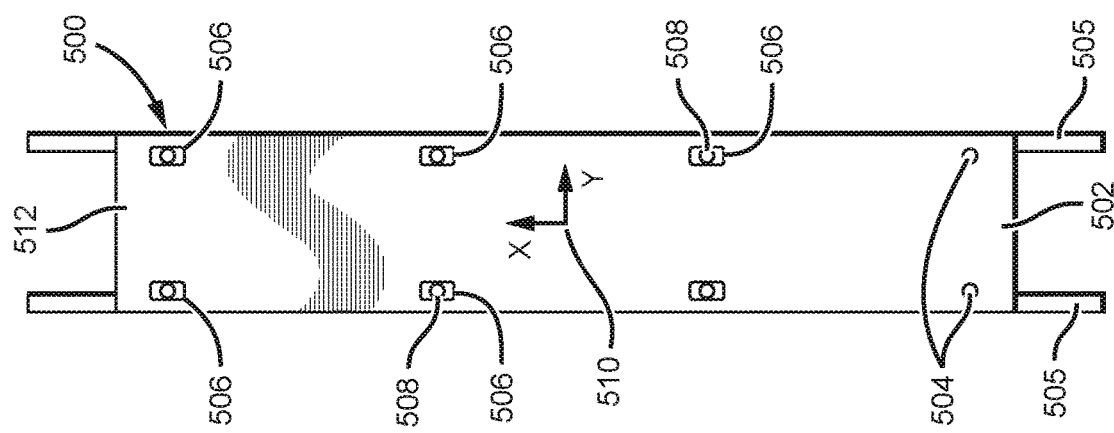
Figure 6:
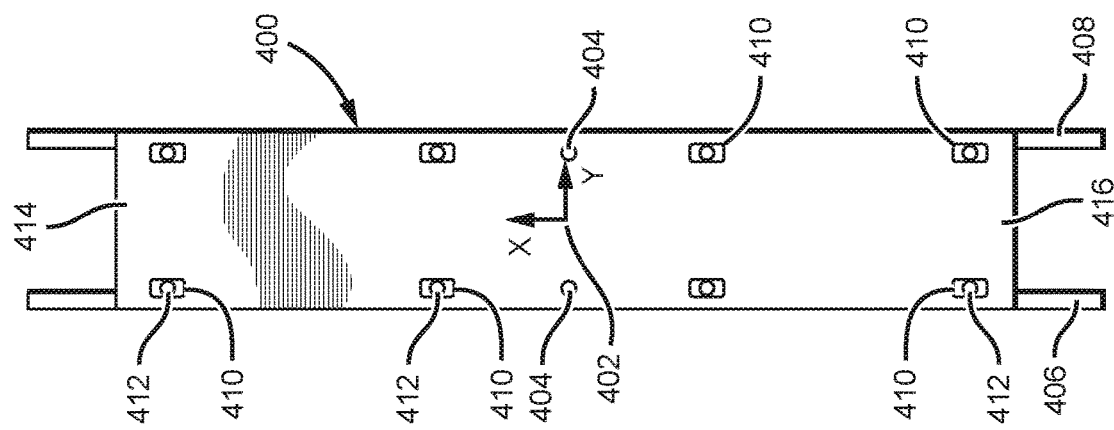

FIGS. 4, 5, and 6 illustrate three different embodiments of a PCB supported by a frame (such as fuselage sidewalls) with the PCB allowed to elastically deform under an axial load and while enhancing the load-carrying capacity of the frame supporting the PCB. In FIG. 4, the PCB 400 is rigidly supported at its center 402 by a pair of mid guide posts 404 that are rigidly coupled to the frame (406, 408). The frame (406, 408) may be a unitary structure or may be formed of a plurality of structures that are rigidly coupled together. A plurality of guide slots 410 are formed in the PCB 400 on its lateral sides, preferably extending through the thickness of the PCB 400. Each guide slot 410 has its major longitudinal axis aligned with a major longitudinal axis (X-axis) of the PCB 400 for receipt of a respective plurality of posts 412 that are rigidly connected to the frame (406, 408). The guide posts 412 and guide slots 410 may be sized such that the guide posts may only slide axially (i.e., along the X-axis), and are restrained from sliding orthogonally (Y-axis). In this manner, when a sudden acceleration is applied to the frame (406, 408) in the axial direction (X-axis), the axial load is transmitted to the PCB 400 through the pair of guide posts 404, and front and rear segments (414, 416) are guided axially during their acceleration-induced axial compression and tension, respectively, by the plurality of guide posts 412 in their respective guide slots 410. Both sides (406, 408) of the frame are also supported against buckling (Y-axis) that may otherwise occur due to the axial load because the guide posts 412 (rigidly coupled to the sides) are laterally restrained within the guide slots 412. In other words, lateral expansion of the frame (406, 408) is inhibited as the posts are restrained from movement in the Y-axis by the guide slots 410 of the PCB 400. In the illustrated example, the PCB is partially decoupled from axial acceleration forces acting on the frame because the guide slots allow the PCB to elastically deform (translate) in the axial direction. With sudden acceleration in the positive X direction and the PCB held rigidly by the mid-guide posts 404, the front segment 414 would experience elastic compression and the rear segment 416 would experience elastic deformation in tension.

In FIG. 5, a PCB 500 is rigidly supported at a distal end 502 with a pair of rear guide posts 504 that are rigidly coupled to the frame 505. The frame 505 may be a unitary structure such as one of a upper or lower section of a UAV fuselage. A plurality of guide slots 506 are formed forward of the pair of rear guide posts 504 that extend along the PCB's lateral sides. Each of the guide slots 506 has its major longitudinal axes aligned with a major longitudinal axis (X-axis) of the PCB 500 and may receive a respective guide post 508 that is rigidly connected to the frame 505. The guide posts 508 and guide slots 506 may be sized such that the guide posts may only slide axially (i.e., along the X-axis) and the guide slots 506 restrict lateral movement of the guide posts 508. During operation, application of sudden acceleration to the frame (406, 408) in the axial direction (X-axis) results in an the axial load being transmitted to the PCB 400 through the pair of rear guide posts 504, and mid and front segments (510, 512) are guided axially during their respective acceleration-induced axial compression by the plurality of guide posts 508 in their respective guide slots 506. Both sides of the frame 505 are also supported against buckling (Y-axis).

FIG. 6 illustrates a PCB 600 that is rigidly supported at its forward end 602 by a pair of rigid forward guide posts 604 coupled. Similarly to FIGS. 4 and 5, guide slots 606 formed along longitudinal sides of the PCB have their respective major axes aligned with a major axis of the PCB 600 to ensure that guide posts 608 received by the guide slots 606 serve to partially decouple acceleration experienced by a frame 610 while inhibiting buckling of the frame while its under axial load. With sudden acceleration in the positive X direction and the PCB held rigidly by the forward guide posts 604, the front, middle and rear segments (602, 612, 614) would experience elastic deformation in tension (extension).

FIG. 7A is a close-up view better illustrating the elastic compression of a PCB during sudden acceleration, with forward and lateral elastic deformation guided by rigid guide posts extending through guide slots formed in the PCB. A PCB 700 may be rigidly coupled to a frame (not shown) through a pair of rigid rear guide posts 702. Forward guide posts 704 are also rigidly connected to the frame, and extend through guide slots 706 disposed along longitudinal sides 708, 710 of the PCB. Respective major axes of the guide slots are oriented along the X-axis (see FIG. 7), with the X-axis coinciding with the predetermined axis of sudden acceleration. Under steady state and with nominal acceleration of the frame, the PCB 700, guide slots 706 and forward guide posts 704 assume the configuration indicated with solid lines. Upon application of a sudden acceleration such as through a positive force applied in the X-axis to the rigid rear guide posts 702, the PCB will experience an elastic compression deformation as indicated by dashed lines 712. Guide slots 706 do not inhibit axial compression of the front end of the PCB about the forward guide posts 704, while inhibiting any lateral translation of the guide posts 704 towards or away from each other such as would be induced if the frame attached to the guide posts 704 beginning to experience buckling.

Figure 7B:
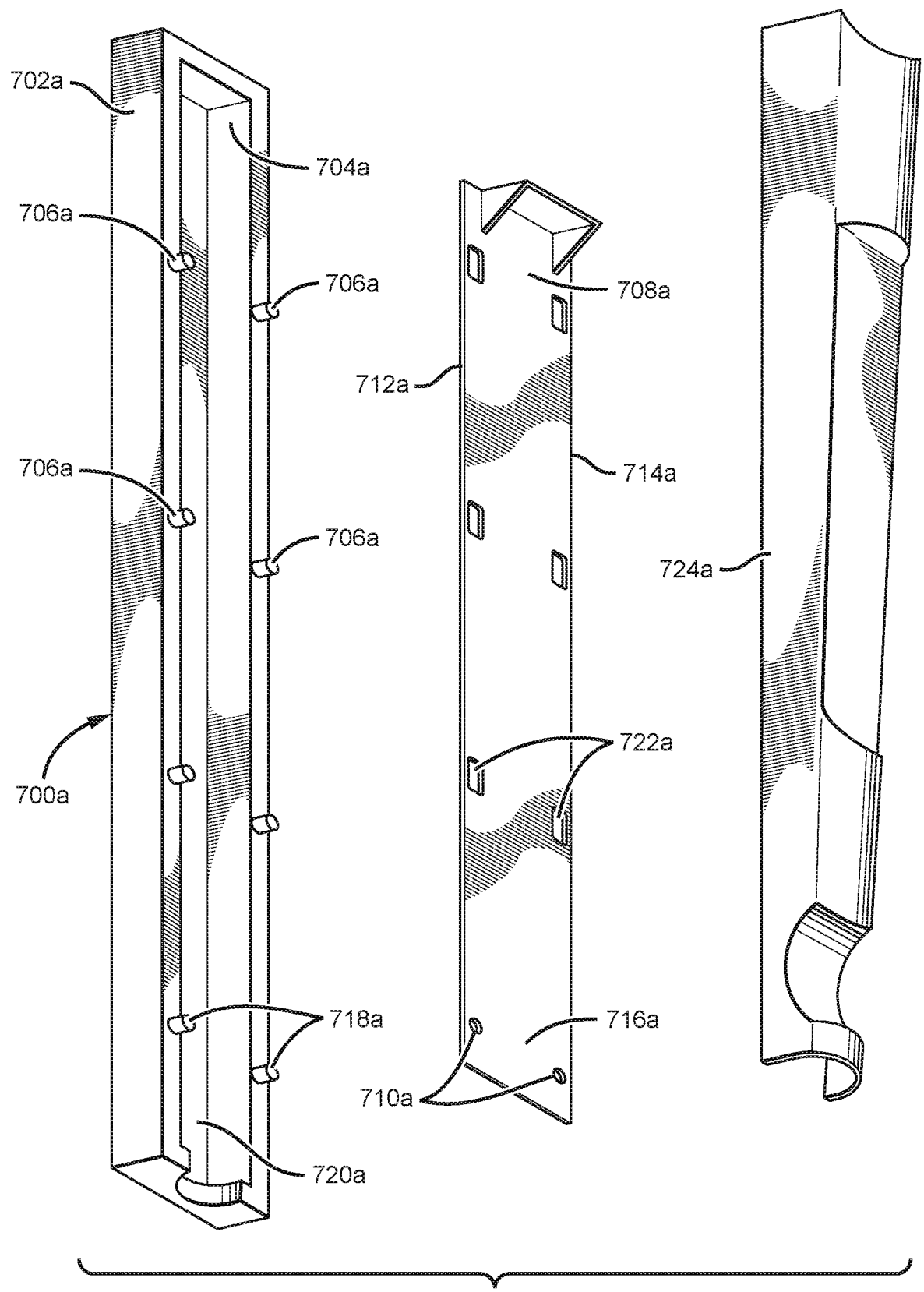
FIG. 7B is an exploded perspective view of one embodiment of a frame in the form of upper and lower fuselage shelves of a UAV that supports an internal mechanical-shock resistant PCB system.

FIG. 7B is an exploded perspective view of one embodiment of a frame in the form of upper and lower fuselage shelves of a UAV that supports an internal mechanical-shock resistant PCB system. A lower fuselage shelf 700a has port and starboard siderails (702a, 704a) that each have a plurality of posts 706a extending from them. A PCB 708a has a pair of holes 710a on opposite longitudinal sides (712a, 714a) extending through a rear portion 716a for receipt of a complementary pair of guide posts 718a extending from a rear portion 720a of the lower fuselage shelf 700a. A plurality of guide slots 722a are disposed along the longitudinal sides (712a, 714a) of the PCB for receipt of the respectively plurality of guide posts 706a. Each one of the plurality of guide slots 722a have their major axis oriented along a major axis of the lower fuselage shelf 700a. The upper fuselage shelf 724a is configured to couple to the lower fuselage shelf 700a without inhibiting axial elastic deformation of the PCB 708a during sudden acceleration.

Figure 8:
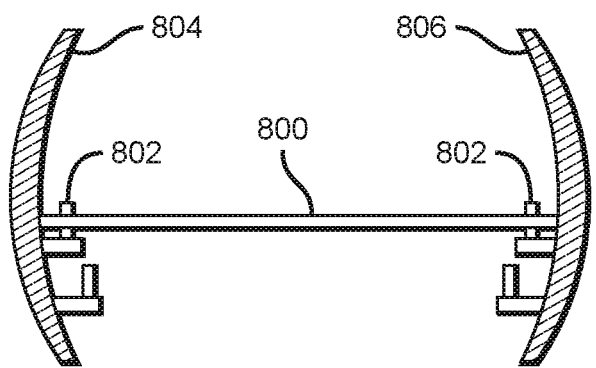
FIG. 8 is a front sectional view of one embodiment of a mechanical-shock resistant PCB system having a single PCB coupled between left and right side rails of a UAV fuselage.

FIG. 8 depicts one embodiment of a mechanical-shock resistant PCB system having a single PCB coupled between left and right side rails of a UAV fuselage. The PCB 800 has a plurality of guide slots (not shown) that are sized to receive a respective plurality of guide posts 802 that are rigidly coupled to and extend from an associated side rail (804, 806). Each of the guide slots has their major axis aligned with the major axis of the side rails. Each guide post 802 is rigidly coupled to its adjacent side rail.

Figure 9:
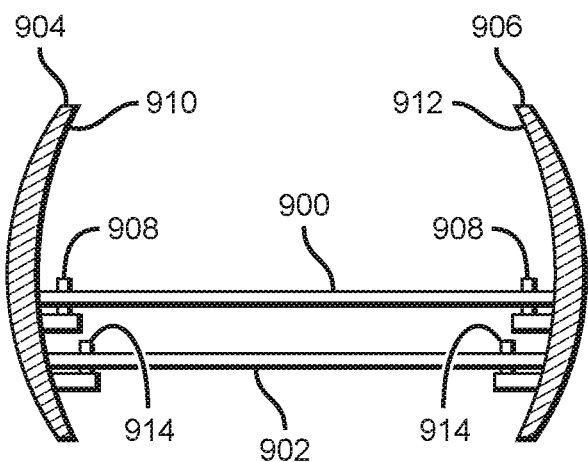
FIG. 9 is a front sectional view of another embodiment of a mechanical-shock resistant PCB system that has two PCBs coupled between left and right side rails in a stacked orientation.

FIG. 9 depicts another embodiment of a mechanical-shock resistant PCB system that has two PCBs coupled between left and right side rails in a stacked orientation. The top and bottom PCBs (900, 902) are spaced apart and extend in generally parallel planes between left and right side rails (904, 906). A top set of guide posts 908 extend from interior sides (910, 912) of respective left and right side rails (904, 906) and slidably couple to guide slots (not shown) of the top PCB. A bottom set of guide posts 914 extend from the interior sides (910, 912) of respective left and right side rails (904, 906) and slidably couple to guide slots (not shown) of the bottom PCB 902. At least two guide posts, one extending from each side rail, are rigidly coupled to the bottom PCB. In a preferred embodiment, the remainder of the top and bottom guide posts are slidably engaged with the top and bottom PCBs, respectively, to enable guided elastic deformation of the PCBs (900, 902) during periods of sudden acceleration.

Figure 10:
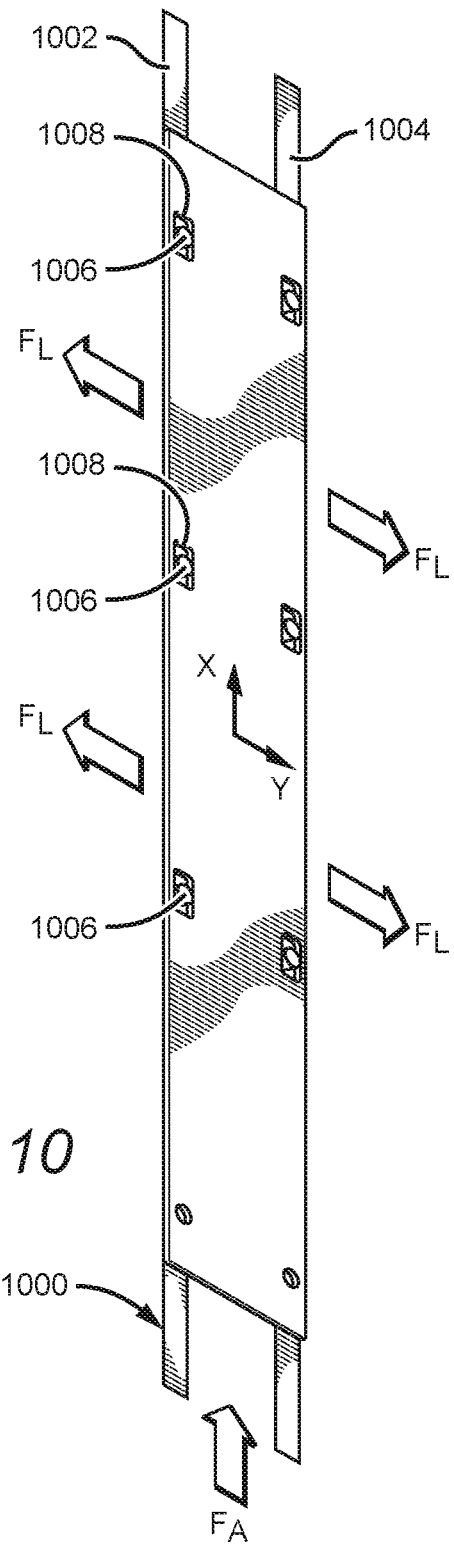
FIG. 10 is a top perspective view of one embodiment of a mechanical-shock resistant PCB system and illustrating lateral force loads (indicated with arrows)

FIG. 10 illustrates lateral forces experienced by left and right side rails of another embodiment of a mechanical-shock resistant PCB system. Upon application of a positive force in the axial direction (X-axis) from a rear side 1000 of the side rails (1002, 1004) (indicated with force, $F_A$), such as that experienced during launch of a UAV that employs such side rails, the side rails (1002, 1004) will experience lateral forces (indicated with force, $F_L$), or buckling tendencies. Consequently, the lateral forces $F_L$ (along the Y-axis) will be transmitted to the guide posts 1006 and opposed by side walls of the slots 1008.

Figures 11, 12:
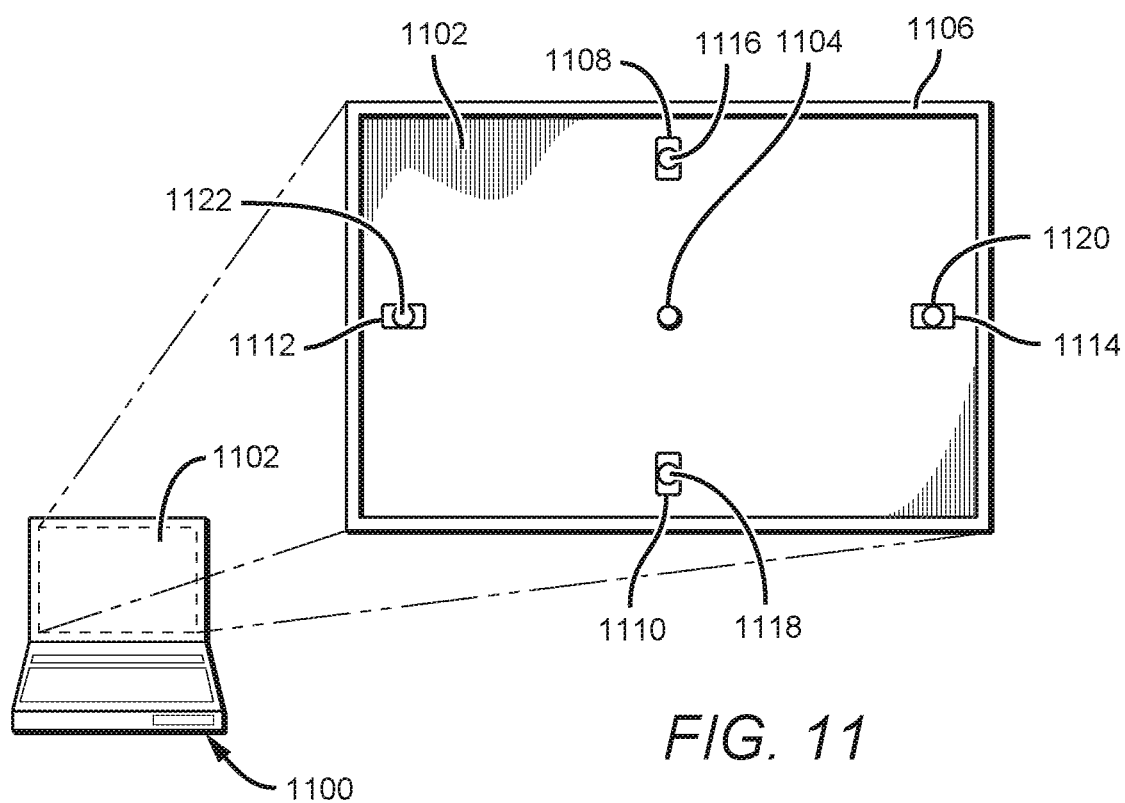
FIG. 11 depicts another embodiment of a mechanical-shock resistant PCB for use in a consumer electronics product embodied as a personal laptop computer.
FIG. 12 is a top plan view of one embodiment of a mechanical-shock resistant PCB for general-purpose use, with elastic deformation due to a force load indicated in dashed lines.

FIG. 11 depicts another embodiment of a mechanical-shock resistant PCB for use in a consumer electronics product such as a personal laptop computer. The laptop computer 1100 may have an internal PCB 1102 seated within a screen portion of the laptop 1100. The PCB 1102 may have a fixed post 1104 extending through a mounting hole to rigidly couple the PCB to a frame 1106. The PCB 1102 may have a plurality of guide slots (1108, 1110, 1112, 1114) to receive a respective plurality of guide posts (1116, 1118, 1120, 1122). Each guide slot (1116, 1118, 1120, 1122) has its major longitudinal axis aligned towards the fixed post and is sized such that each guide post (1108, 1110, 1112, 1114) is restrained in every direction but for the associated major longitudinal axis of the guide slot.

FIG. 12 illustrates one embodiment of a mechanical-shock resistant PCB for general-purpose use. The PCB 1200 may be fixed at a central mounting point 1202 that mounts the PCB 1200 to a frame or other fixed support. The mounting point may be disposed at a center of mass of the PCB 1200, preferably as measured after assembly with seated electrical components (1204, 1206, 1208, 1210). Guide slots (1212, 1214, 1216, 1218) may receive a respective plurality of guide posts (1220, 1222, 1224, 1226), each of the guide posts having a major longitudinal axis aligned towards the fixed post. Each of the plurality of guide posts is sized such that a received guide post is substantially restrained from motion in every direction but for the associated major longitudinal axis of the guide slot. With this configuration, a sudden acceleration in the positive X-axis may result in compression elastic deformation of the PCB along its "top" portion (top circumference indicated by dashed line 1228) and elongation elastic deformation along its "bottom" portion (bottom circumference indicated by dashed line 1230). Upper slot 1212 and lower slot 1216, defined as "upper" and "lower" in relation to the direction of sudden acceleration, allow the PCB to deform in the X-axis, but inhibit deformation in the Y-axis, while the central mounting point 1202 fixes the PCB 1200 to the frame (not shown).

FIG. 13 illustrates another embodiment of a PCB having a fixed mounting point and guide slots that each accept a guide post for use during sudden angular acceleration. The PCB 1300 may be fixed at a central mounting point (P) that mounts the PCB to a support post 1318. The fixed mounting point may be disposed at a center of mass of the PCB. Each of the guide slots (1302, 1304, 1306, 1308) have a respective major axis that is directed circumferentially about the PCB 1300, and may accept a respective plurality of guide posts (1310, 1312, 1314, 1316). As the PCB 1300 is suddenly rotationally accelerated (indicated by an arrow A), the PCB may deform torsionally about the central mounting point to reduce peak angular acceleration towards an outer perimeter section of the PCB. Material deformation may be represented by dashed line T for a positive torsional moment in accordance with the X-Y axis identified in FIG. 13.

FIGS. 14A and 14B are a compression displacement versus PCB location graph and PCB illustration, respectively, depicting a force $F_A$ applied to one embodiment of a PCB having two fixed mounting points at its distal end, and having a major axis of each of the mounted electrical components directed perpendicularly to a major axis of each of the guide slots. In such a configuration, electrical components 1400 having relatively larger widths ($D_W$) may be positioned at points axially removed from the fixed mounting points 1402, while electrical components 1404 having relatively smaller widths ($D_W$) may be positioned at points closer to the fixed mounting points 1402. By distributing the electrical components in such a manner, the narrower components 1404, which may be relatively less sensitive to PCB board deformation than the wider components 1400, would be positioned in a PCB area 1406 having relatively larger deformation than that experienced by the larger components 1400 positioned in a PCB area 1408 further removed from the fixed mounting points 1402 (see FIG. 14A) and experiencing relatively less deformation. As used herein, "width" is measured in the X-axis, a direction parallel to anticipated sudden acceleration. By way of example, a sudden and large force $F_A$ applied to left and right side rails would result in a larger compression deformation in the PCB 1410 as one approaches the fixed mounting points (see FIG. 14A). Similarly, the PCB 1410 would experience less compressive deformation at points removed from the fixed mounting points.

In alternative embodiments, the fixed mounting points may be positioned at a "forward" end of the PCB, such that a positive sudden acceleration produces an elongation deformation in the PCB (i.e., "hanging" from the fixed mounting points rather than supported by the fixed mounting points during the sudden acceleration). In such a design, points closer to the forward position, and closer to the fixed mounting points, would experience greater elongation deformation than those points removed from the fixed mounting points. Therefore, electronic components having a narrower width $D_W$ may be assembled or otherwise disposed closer to the fixed mounting points than those electrical components having a larger width $D_W$.

FIG. 14C is a graph depicting electrical component width $D_W$ versus distance from the fixed mounting points. More particularly, a distribution of electrical component thicknesses, as measured in the illustrated X-axis, may follow a clear distribution, trending or stepping towards larger electrical component width (Wc) for components mounted at points further removed from the fixed mounting points than the electrical component thicknesses (Dt) for electrical components mounted nearer the fixed mounting points.

Also, although width $D_W$ may generally be used as a proxy for sensitivity to PCB deformation, electrical component material may also be a consideration for placement that may be distal or proximal to the fixed mounting points. For example, ceramic components are generally less tolerant to PCB deformation than are leaded IC components. Therefore, such a distribution of components width (as a proxy for component deformation sensitivity) versus distance from the fixed mounting points may instead use "component density" versus distance from the fixed mounting points. In such a scheme, ceramic components would be seen as positions distal from the fixed mounting points while components such as leaded IC would be closer, as the leaded IC would be more tolerant of PCB deformation during periods of sudden acceleration.

FIG. 15 is a simplified overhead plan view depicting a PCBA board rigidly coupled to a fuselage at a proximal end and elastically coupled at a plurality of points removed from the proximal location so that the PCBA board experiences substantially similar elastic deformation along its length under high-G acceleration. The PCB board 1500 is rigidly coupled to the fuselage 1502 on a proximal end 1504 of the PCB through rigid pins R1 and R2. In the case where the fuselage (Xf) compresses more than the PCBA (Xpc) (which is desirable), R1 and R2 may rigidly hold the PCBA, while posts EP1 through EP∞ are specifically designed to have elastic spring rates to distribute the load evenly across the PCBA thus allowing the PCBA to accelerate while Xpc change is minimized. In other words, if the fuselage may be simply modeled as a giant spring; the butt end compresses towards the front and each elastic post gently lifts the PCBA proportionately to its segment mass.

In summary of the systems disclosed, above, a shock resistant fuselage system is disclosed that has first and second fuselage side walls, each of the first and second fuselage side walls having a plurality of guide posts, and a PCB rigidly attached to at least one of the first and second fuselage side walls, the PCB having a plurality of guide slots, each of the plurality of guide posts slideably seated in a respective one of the plurality of guide slots so that elastic deformation of the PCB is guided by the guide slots between the first and second fuselage side walls. The first and second fuselage side walls may be first and second fuselage side walls of a unitary fuselage clam shell. A major longitudinal axis of each of the plurality of guide slots may extend parallel to a major longitudinal axis of the first and second fuselage side walls. In some embodiments, PCB is rigidly attached to the at least one of the first and second fuselage side walls at a front of the PCB board. Alternatively, the PCB may be rigidly attached to the at least one of the first and second fuselage side walls at a rear of the PCB board. The system may also include a plurality of electrical components mounted to the PCB, each of the plurality of electrical components mounted with their major longitudinal axis oriented perpendicularly to the major longitudinal axis of each of the first and second fuselage side walls. The system may also include a plurality of electrical components mounted to the PCB such that a larger proportion of larger electrical components of the plurality of electrical components are mounted at a PCB front end 1504 than a PCB rear end 1506.

Another PCB mounting system is described that has a PCB board having a plurality of guide slots, and a frame rigidly coupled to the PCB board and having a plurality of guide posts, each one of the plurality of guide posts seated in a respective one of the plurality of guide slots, so that elastic deformation of the PCB is guided by the guide slots. In such an embodiment, a major longitudinal axis of each one of the plurality of guide slots may extend parallel to a major longitudinal axis of the PCB. Alternatively, the frame may be rigidly coupled to the PCB board in a center region of the PCB, and a major longitudinal axis of each one of the plurality of guide slots may extend radially toward the center region of the PCB.

A method of printed circuit board (PCB) shock resistance is disclosed that includes inducing an acceleration in a PCB in a first direction, rigidly restraining a PCB at one end of the PCB during the acceleration, and guiding elastic deformation of the PCB along the first direction, so that the PCB experiences reduced peak acceleration at PCB points removed from the one end. The PCB restraint may include coupling the PCB to an unmanned aerial vehicle fuselage.

While various embodiments of the invention have been described, it will be apparent to those of ordinary skill in the art that many more embodiments and implementations are possible that are within the scope of this invention.

What is claimed is:

1. A method comprising:
   attaching a printed circuit board (PCB) to a frame having a plurality of guide posts and at least one fixed post, wherein the PCB comprises a plurality of guide slots and at least one mounting hole;
   seating at least one guide post of the plurality of guide posts slideably in a respective one of the plurality of guide slots,
   seating at least one fixed post fixedly in a respective one of the at least one mounting hole;
   arranging a plurality of electrical components mounted to the PCB such that each of the plurality of electrical components are mounted with their major longitudinal axis oriented perpendicularly to a major longitudinal axis of the frame; and
   guiding elastic deformation of the PCB by the guide slots.

2. The method of claim 1, wherein the frame comprises one or more fuselage side walls.

3. The method of claim 2, wherein the one or more fuselage side walls are first and second fuselage side walls of a unitary fuselage clam shell.

4. The method of claim 1, wherein the frame is a unitary section of a fuselage.

5. The method of claim 1, wherein a major longitudinal axis of each of the plurality of guide slots extends parallel to the major longitudinal axis of the frame.

6. The method of claim 1, further comprising:
   attaching the PCB to the frame rigidly at a front of the PCB board.

7. The method of claim 1, further comprising:
   attaching the PCB to the frame rigidly at a rear of the PCB board.

8. A method comprising:
   attaching a printed circuit board (PCB) to a frame having a plurality of guide posts and at least one fixed post, wherein the PCB comprises a plurality of guide slots and at least one mounting hole;
   seating at least one guide post of the plurality of guide posts slideably in a respective one of the plurality of guide slots,
   seating at least one fixed post fixedly in a respective one of the at least one mounting hole;
   arranging a plurality of electrical components mounted to the PCB such that a larger proportion of larger electrical components of the plurality of electrical components are mounted at a PCB front end than a PCB rear end; and
   guiding elastic deformation of the PCB by the guide slots.

9. The method of claim 8, wherein the frame comprises one or more fuselage side walls.

10. The method of claim 9, wherein the one or more fuselage side walls are first and second fuselage side walls of a unitary fuselage clam shell.

11. The method of claim 8, wherein the frame is a unitary section of a fuselage.

12. The method of claim 8, wherein a major longitudinal axis of each of the plurality of guide slots extends parallel to the major longitudinal axis of the frame.

13. The method of claim 8, further comprising:
    attaching the PCB to the frame rigidly at a front of the PCB board.

14. The method of claim 8, further comprising:
    attaching the PCB to the frame rigidly at a rear of the PCB board.

15. A method comprising:
    attaching a printed circuit board (PCB) to a frame having a plurality of guide posts and at least one fixed post, wherein the PCB comprises a plurality of guide slots and at least one mounting hole;
    seating at least one guide post of the plurality of guide posts slideably in a respective one of the plurality of guide slots,
    seating at least one fixed post fixedly in a respective one of the at least one mounting hole;
    arranging a plurality of electrical components mounted to the PCB such that electrical components having relatively larger widths are mounted distal from the at least one mounting hole; and
    guiding elastic deformation of the PCB by the guide slots.

16. The method of claim 15, further comprising:
    arranging the plurality of electrical components mounted to the PCB such that electrical components having relatively smaller widths are mounted closer to the at least one mounting hole than the electrical components having relatively larger widths.

17. The method of claim 15, further comprising:
attaching the PCB to the frame rigidly at a front of the PCB board.

18. The method of claim 15, further comprising:
attaching the PCB to the frame rigidly at a rear of the PCB board.

19. The method of claim 15, wherein a major longitudinal axis of each of the plurality of guide slots extends parallel to the major longitudinal axis of the frame.

20. The method of claim 15 wherein elastic deformation of the PCB is larger in an area of the PCB proximate the at least one fixed post.

* * * * *